(12) United States Patent
Chen

(10) Patent No.: US 7,557,413 B2
(45) Date of Patent: Jul. 7, 2009

(54) SERPENTINE BALLASTING RESISTORS FOR MULTI-FINGER ESD PROTECTION DEVICE

(75) Inventor: Ker-Min Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 223 days.

(21) Appl. No.: 11/595,120

(22) Filed: Nov. 10, 2006

(65) Prior Publication Data

US 2008/0111193 A1    May 15, 2008

(51) Int. Cl.
*H01L 23/62* (2006.01)

(52) U.S. Cl. .................. 257/360; 257/355; 257/363; 257/E27.016

(58) Field of Classification Search .......... 257/360, 257/363, 355, E27.016
See application file for complete search history.

(56) References Cited

U.S. PATENT DOCUMENTS

| | | | |
|---|---|---|---|
| 4,825,280 A * | 4/1989 | Chen et al. ............. | 257/659 |
| 5,498,892 A * | 3/1996 | Walker et al. .......... | 257/336 |
| 5,721,439 A | 2/1998 | Lin ........................ | 257/204 |
| 6,004,838 A * | 12/1999 | Ma et al. ................ | 438/200 |
| 6,222,247 B1 * | 4/2001 | Tung ...................... | 257/536 |
| 6,583,972 B2 * | 6/2003 | Verhaege et al. ....... | 361/56 |
| 6,587,320 B1 | 7/2003 | Russ et al. .............. | 361/56 |
| 6,927,458 B2 * | 8/2005 | Worley ................... | 257/361 |
| 7,005,708 B2 | 2/2006 | Mergens et al. ........ | 257/360 |
| 7,183,612 B2 * | 2/2007 | Okushima .............. | 257/350 |
| 7,317,228 B2 * | 1/2008 | Chen ...................... | 257/360 |
| 7,397,089 B2 * | 7/2008 | Zhang et al. ........... | 257/360 |
| 2004/0164354 A1 * | 8/2004 | Mergens et al. ........ | 257/355 |
| 2004/0251502 A1 * | 12/2004 | Reddy et al. ........... | 257/356 |
| 2005/0045954 A1 * | 3/2005 | Kao ........................ | 257/355 |

* cited by examiner

*Primary Examiner*—David Vu
*Assistant Examiner*—Brandon Fox
(74) *Attorney, Agent, or Firm*—K & L Gates LLP

(57) ABSTRACT

This invention discloses a ballasting resistor for an electrostatic discharge (ESD) device that comprises at least one first active region forming a source/drain of an ESD discharge transistor, at least one resistive element with a serpentine shape formed in a single layer of a semiconductor structure, wherein the resistive element has a first terminal coupled to the first active region and a second terminal coupled to a bonding pad including power supply (Vdd or Vss) pads.

20 Claims, 6 Drawing Sheets

SERPENTINE BALLASTING RESISTORS FOR MULTI-FINGER ESD PROTECTION DEVICE

BACKGROUND

The present invention relates generally to an electrostatic discharge (ESD) protection device, and more particularly to a multi-finger ESD protection device with ballasting resistance for reducing the voltage stress on input/output pads of integrated circuits (ICs) during an ESD event.

As the feature sizes of semiconductor devices are being reduced to the nanometer level, semiconductor devices are getting more susceptible to ESD events. ICs formed of MOS (metal-oxide semiconductor) transistors are especially prone to ESD damages. A common technique to prevent ICs from being damaged by ESD events is using a multi-finger ESD protection device on the input/output pads of ICs.

A multi-finger ESD protection device is a series of transistors placed in parallel like fingers across the input/output pads of an IC so that it can have relatively large device widths to discharge ESD currents to ground potential Vss. To function properly, the trigger voltage of the multi-finger ESD protection device should be smaller than the trigger voltage of the other devices not used for ESD protection. Moreover, the multi-finger ESD protection device should not turn on during normal operation of an input/output circuit. During the conducting state, the multi-finger ESD protection device should provide a low resistance and have a high current handling capability.

A well-known problem with the multi-finger ESD protection device is the possibility of non-uniform triggering of the fingers. To ensure uniform turn-on of the multi-finger ESD protection device, an approach is to add ballasting resistors to each finger to increase the trigger voltage of the subsequently triggered finger, or to increase the substrate resistance of the MOSFET (Metal-Oxide Semiconductor Field Effect Transistors). For instance, the substrate resistance can be increased by increasing the distance of the substrate contact from the source/drain region of the MOSFET, or by increasing the P-well or N-well sheet resistance.

FIG. 1 depicts a multi-finger ESD protection device according to a conventional art. The ESD protection device is formed by NMOS (N-channel Metal-Oxide Semiconductor) multi-finger transistors placed in parallel in a driver block 100. Each finger transistor has a MOS structure with a source 120a, a drain 130a and a gate electrode 110a. Two adjacent fingers share the same source or drain regions. Triggering the first finger may propagate and trigger adjacent fingers in the driver block 100.

To increase the sheet resistance or the trigger voltage of the subsequently triggered finger, resist protective oxide (RPO) film 140a and 140b are formed on the drain regions 130a. Alternatively, the RPO films 140a can also be formed on the source region 120a. The RPO film 140a or 140b is usually applied on the I/O portion of an IC as a protection layer while forming electrical contacts to the bonding pads. During a typical salicide category of fabrication technology, a layer of RPO film is first deposited over the active area (OD). Then, a resist mask is formed over the area covered by the RPO film to protect the field effect transistor area from subsequent process steps. The RPO film in the exposed areas of the IC is then etched. The remaining RPO films function as ballasting resistance for ESD protection.

Nevertheless, there are several disadvantages with this approach. First, forming the RPO film may have an adverse influence on the yield. When wet etching is applied, the process will create undercut profiles near the edge of the resist mask, resulting in poor dimensional control and resist mask peeling and even mask lift-off. Second, the RPO area may increase the size of the drain/source region and cause the mechanical stress effect, known as LOD (Length of Oxide) effect, to each finger of the ESD protection device.

FIG. 2 depicts another ballasting resistor structure as disclosed in U.S. Pat. No. 5,721,439 that uses polysilicon strips as ballasting resistors to impose a gate delay. The ballasting resistors 203 are formed by polysilicon blockage and evenly distributed throughout the drain region 220 to provide substantially uniform diffusion resistance between the drain contact 202 and the gate electrode 201 while increasing the diffusion resistance of the drain region 220. However, the disadvantage of this structure is that the polysilicon 204 are floating gates that may create reliability issues, such as punch-through or short. Moreover, the drain region 220 with the ballasting resistors 203 is considered relatively large because they may suffer area efficiency on the input/output of an IC.

FIG. 3 shows another approach as described in U.S. Pat. No. 6,587,320, called "back-end-ballasting". In this embodiment, the ESD ballasting is formed by a ballasting network consisting of "back-end" elements, such as contact-to-silicon, contact-to-poly and silicided polysilicon. As shown in FIG. 3, the approach uses a meandering strip 302 extending from the common terminal 301 to the drain region 303 of the ESD device 320. The meandering strip 302 creates a resistance path that connects a plurality of metallization layers M1~M3, polysilicon layer P1 and interconnecting vias V1~V2 to form ballasting resistance.

It is known that any additional layer or via can add resistance to the ballasting resistance. By making vertical interconnections to form back-end ballasting resistors, this approach can solve the problems induced by the LOD effects. However, the tradeoff is the increased cost and complexity in the manufacturing process due to the vertically formed resistance path.

As such, what is needed is a new structure of the multi-finger ESD protection device with the ballasting resistance that can increase area efficiency of MOS transistors in fully silicided technologies, and uniformly turn on each finger of the multi-finger ESD protection device.

SUMMARY

This invention discloses a ballasting resistor for an electrostatic discharge (ESD) device that comprises at least one first active region forming a source/drain of an ESD discharge transistor, at least one resistive element with a serpentine shape formed in a single layer of a semiconductor structure, wherein the resistive element has a first terminal coupled to the first active region and a second terminal coupled to a bonding pad including power supply (Vdd or Vss) pads.

The structure design of the invention, together with additional objectives and advantages thereof will be best understood from the following description of specific embodiments when read in connection with the accompanying drawings.

DESCRIPTION

The present invention is presented to ensure the uniform turn-on of the multi-finger ESD device by increasing ballasting resistance in the source/drain regions without causing LOD effects. The purpose of increasing the ballasting resistance is to ensure that the trigger voltage of the subsequently triggered finger can be increased and eventually each finger can be turned on in a uniform manner. Moreover, as memory and logic devices are tending to be formed on the same integrated circuit, the present invention is also presented to form the ballasting resistors using the salicide fabrication process same as forming the electrical contacts to the FET elements.

Figure 1:
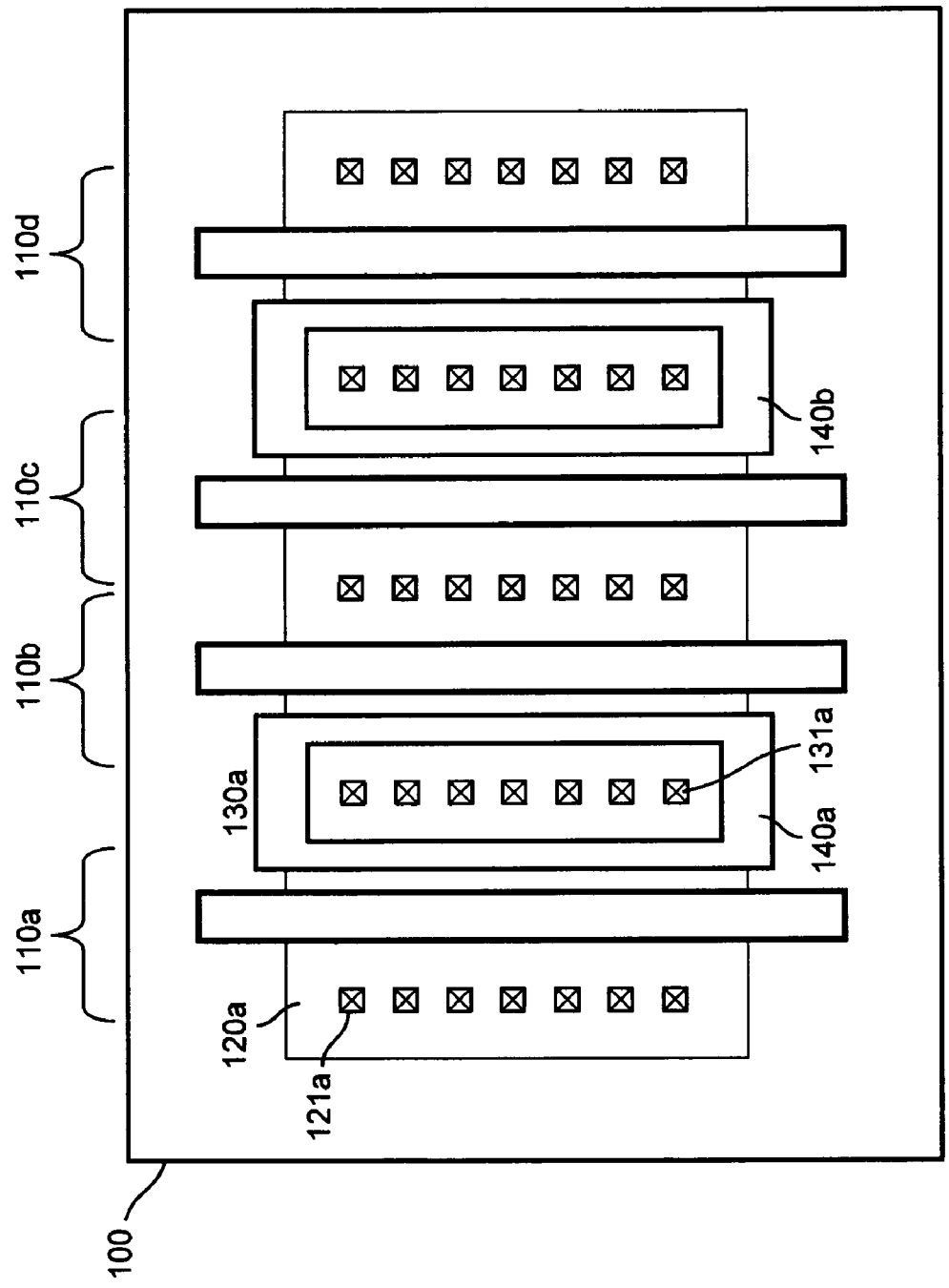
FIG. 1 illustrates a conventional ESD protection device using RPO as ballasting resistance.
Figure 2:
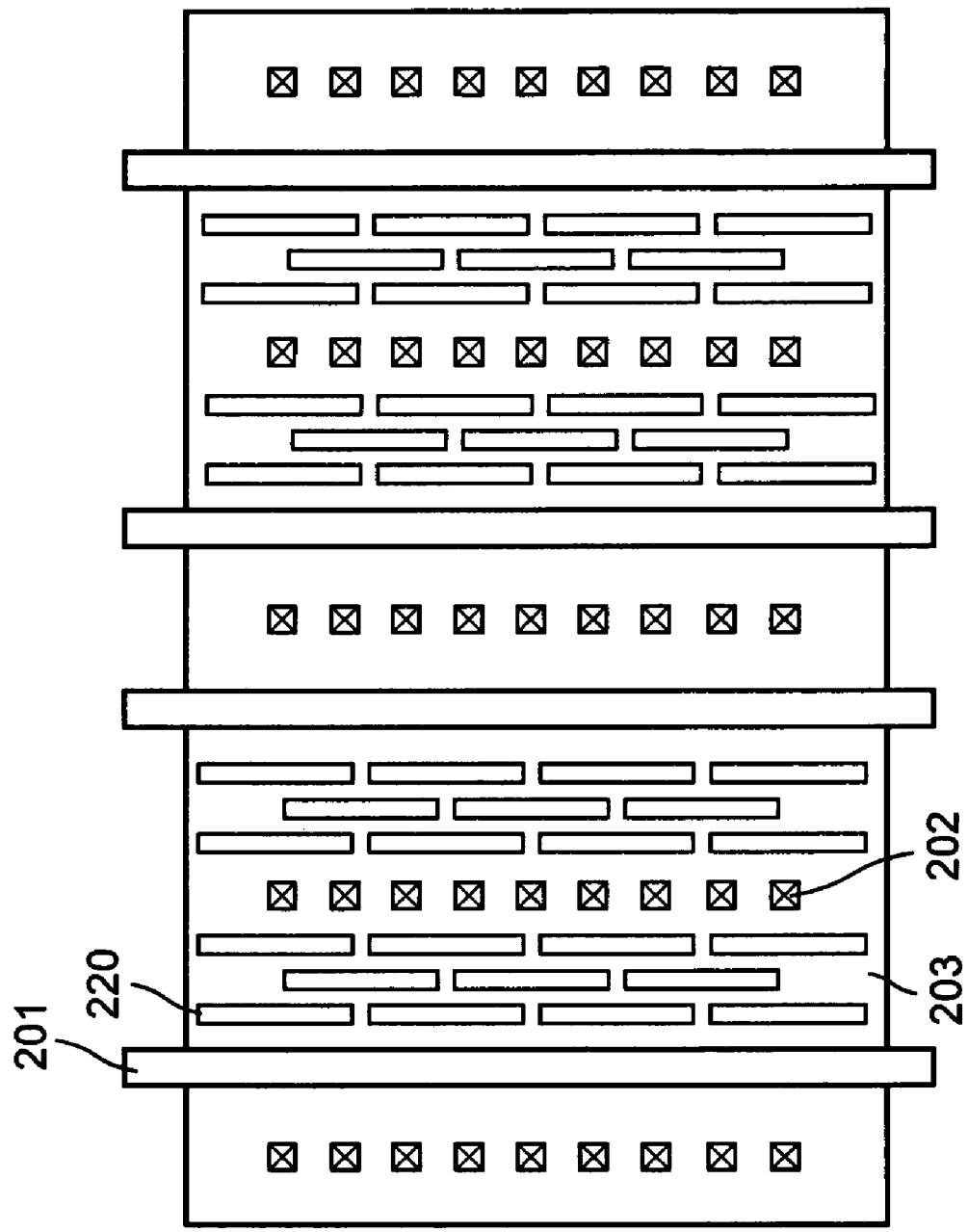
FIG. 2 illustrates a conventional ESD protection device with island-shaped ballasting resistance.
Figure 3:
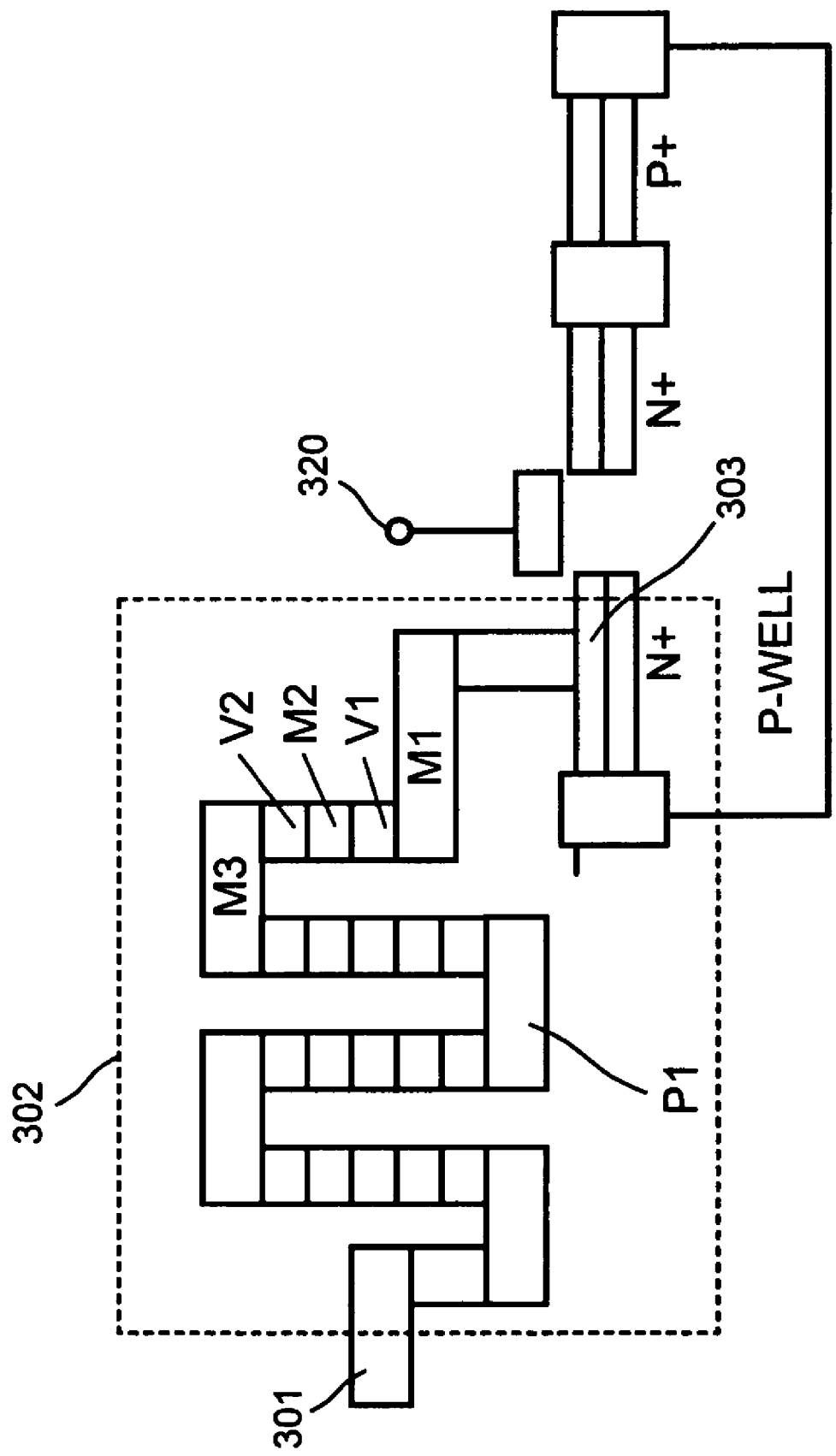
FIG. 3 illustrates another conventional ESD protection device with back-end-ballasting resistors.

FIGS. 1, 2 and 3 have already been described and discussed as the relevant background to the present invention. They require no further discussion here.

Figure 4:
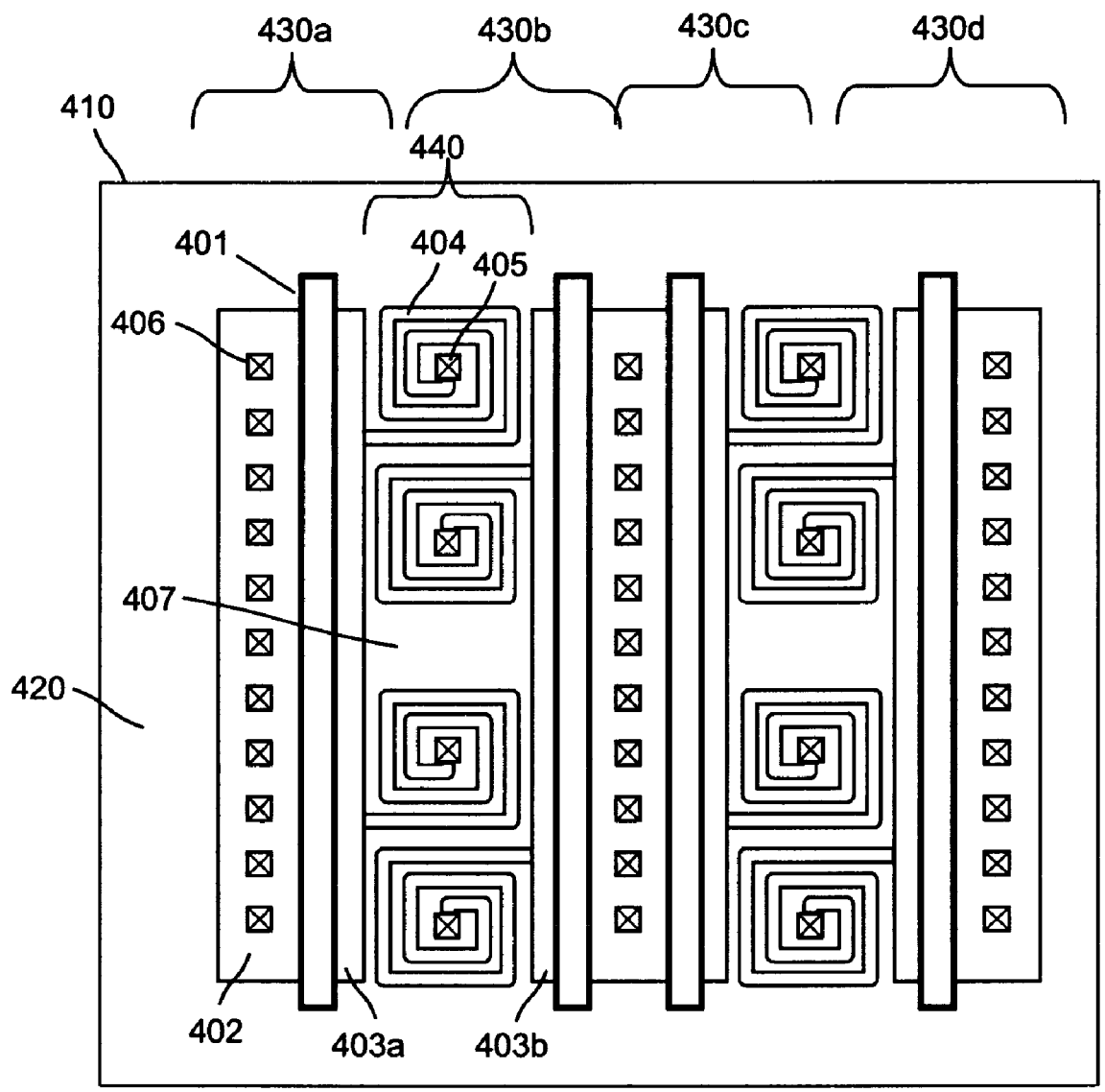
FIG. 4 illustrates a preferred embodiment of the present invention with spiral ballasting resistors.

FIG. 4 depicts the ESD protection device having resistant elements in a spiral shape according to a preferred embodiment of the present invention. The ESD protection device includes a driver block 410 with multi-finger transistors 430a~d. The multi-finger transistors 430a~d are fully silicided NMOS transistors formed on silicided active area 420, which is formed as N+OD inside either Psubstrate or P-well. For instance, the finger transistor 430a consists of a source region 402, a drain region 403a and a gate electrode 401. The gate electrode 401 is formed by a polysilicon line. The source region 402 and the drain region 403a are formed by a typical silicided process. The multi-finger transistors 430a~d include multiple channels to discharge ESD currents. Each channel is defined by a contact 406 in the source region 402 and a corresponding contact 405 in one terminal of the serpentine ballasting resistor. The other terminal of the serpentine ballasting resistor is connected to the drain of the transistor 430a through a piece of active region (OD).

Referring to FIG. 4, the resistive element 404 surrounds the contact 405 in a spiral shape with one end coupled to the drain region 403a and the other end coupled to the contact 405. Therefore, the elements 404 form resistors coupled between a bonding pad and the ESD transistors 430a with desired resistance yet occupy relative small areas.

Although the element 404 shown in FIG. 4 winds clockwise, it is obvious to persons skilled in art that counter-clockwise winding can produce the same effect.

The resistive elements 404 are formed in a substrate material, such as silicided material, or nickel silicide and each on the same layer. The advantage of using silicided material is that the process for forming the ESD protection device can be easily integrated with the same manufacturing process for making integrated circuits. Moreover, it is known that silicided material has better electron migration performance than metallization material. Alternatively, the resistive elements 404 can also be formed from polysilicon, or metallization material as long as it can provide high resistance in a predetermined area.

As intended by such design, the ESD current will route around the spiral resistive elements, resulting in the increase of the trigger voltage of the subsequently triggered finger transistor. In this embodiment, the LOD effect is almost resolved because the distance from poly gate to shallow trench isolation (STI) of each finger is substantially the same. The serpentine shape of the resistive element helps to increase the resistance path. There are various modifications of the serpentine shape to extend the resistance path, including various zigzag shapes as shown in FIGS. 5 and 6.

Figure 5:
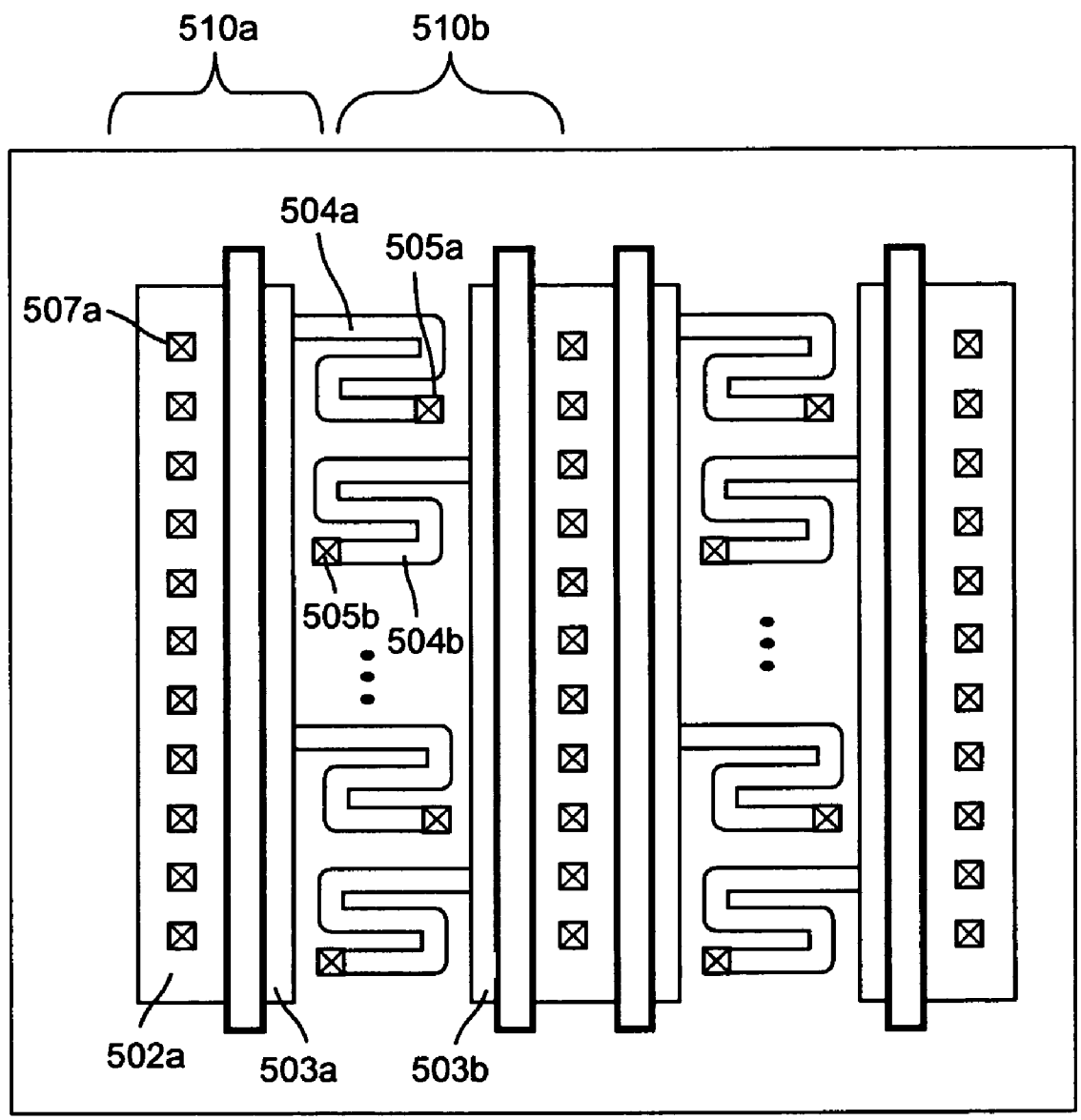
FIG. 5 illustrates another preferred embodiment of the present invention with zigzag ballasting resistors.

In FIG. 5, the multi-finger transistor layout is substantially the same as that in FIG. 4. The major difference is in the layout of resistive elements 504a~b. Refer to FIG. 5, in this embodiment, the resistive element 504a is in a zigzag shape with one end coupled to the drain region 503a and the other end coupled to the contact 505a. The resistive element 504a functions as ballasting resistors. The contact 507a in the source region 502a and its corresponding contact 505a define a channel for discharging ESD current. Please note that the contact 505a is slightly offset to the drain region 503b of finger transistor 510b for the purpose of extending the resistance path. For the same reason, the contact 505b is also slightly offset to the drain region 503a of finger transistor 510a.

Figure 6:
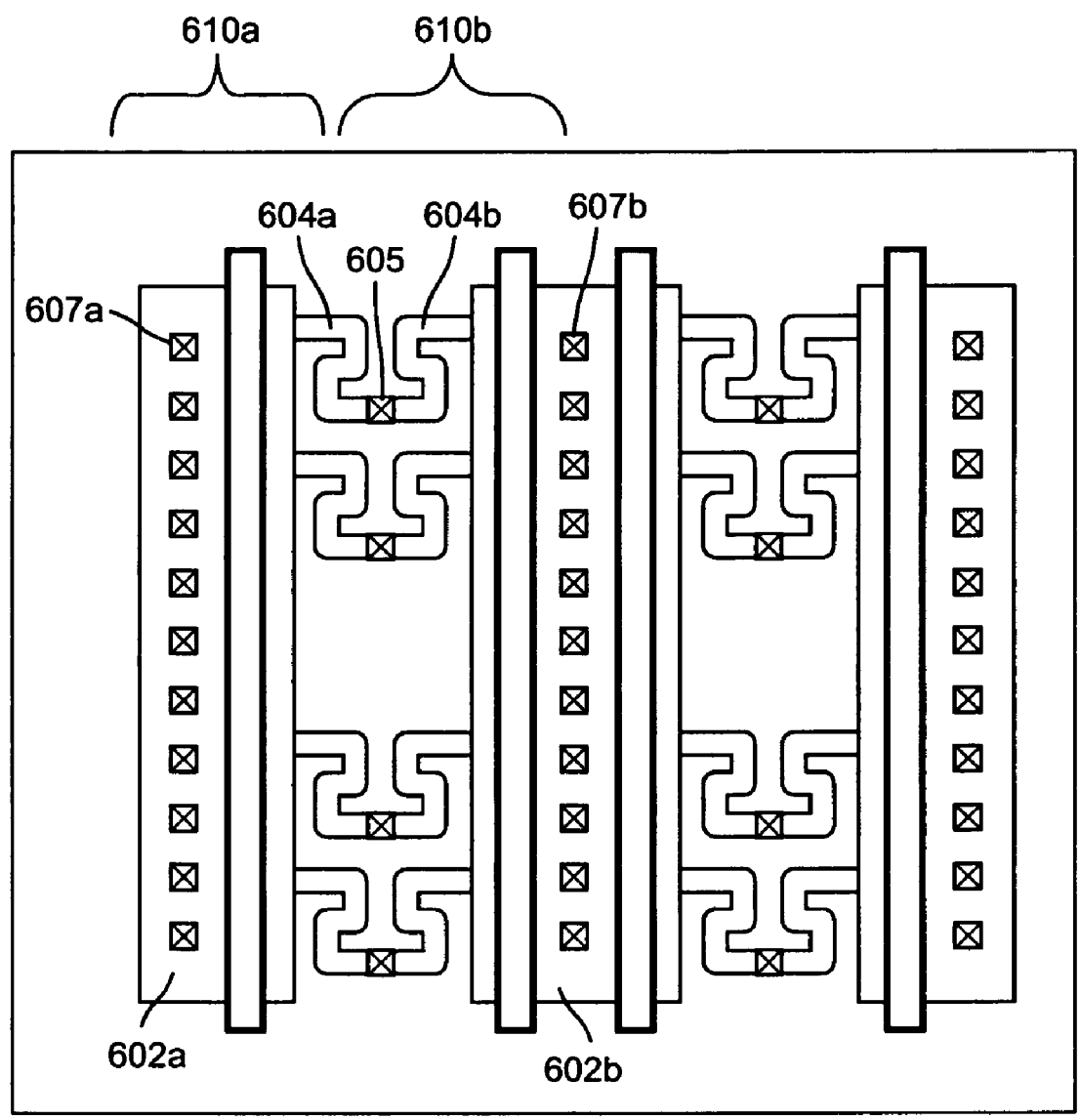
FIG. 6 illustrates yet another preferred embodiment of the present invention with meandering ballasting resistors and common contacts.

FIG. 6 shows another layout of resistive elements with a meandering shape and a common contact according to another preferred embodiment of the present invention. The multi-finger transistor layout is substantially the same as those in FIGS. 4 and 5. In this embodiment, the resistive elements 604a and 604b are in a meandering shape and share the same contact 605 to save space. The contact 607a in the source region 602a and its corresponding contact 605 define a channel for discharging ESD current. The resistive elements 604a and 604b provide ballasting resistance. On the other hand, the contact 607b in the source region 602b and its corresponding contact 605 also define a channel for discharging ESD current.

As persons skilled in the art can appreciate that different values of resistance can be obtained by adjusting the length and width of the resistant element, the distance between the contact and the gate, as well as the number of resistant elements in a row. To determine the ballasting resistance for the ESD protection device, we can apply the following formula:

$$Rb = (L/W) \times Rsh/N,$$

where "Rb" stands for ballasting resistance for a resistive element, "Rsh" for sheet resistance, "L" for length, "W" for width, "N" for the number of resistive elements on a drain/source side.

The following table shows the sheet resistance per-square (Rsq) in various manufacturing processes with respect to various line-width and space requirements for the resistive elements under the minimum design rules for core functional elements of the IC:

| term | scale | | | |
|------|---------|---------|---------|---------|
|      | 0.18 μm | 0.13 μm | 0.09 μm | 0.065 μm |
| Rsq  | 4.1 Ω   | 7.06 Ω  | 8.41 Ω  | 16.88 Ω  |
| Width | 0.22 μm | 0.15 μm | 0.11 μm | 0.08 μm |
| Space | 0.28 μm | 0.21 μm | 0.14 μm | 0.11 μm |

Please note that "Width" means line width of the serpentine resistive element; "Space" means the distance between two line segments of the serpentine resistive element.

From this table, we can see that the value of the square resistance increases as the line width shrinks. In other words, resistance works more efficiently in a nanometer semiconductor device than in a sub-micron semiconductor device.

Following the rules stated above, we can easily get the resistance value for a given finger transistor with 20 contacts on its drain region and made by a 65 nanometer process. In this instance, the resistive element has a given finger width of 33 μm and length of 0.48 μm. By looking up the table, we can find that the square resistance for a 65 nanometer process is 16.88 Ω, and the minimum design rules for the length and space of the resistive element. Then, applying the formula, we can get the ballasting resistance with the given length of only 0.48 um:

$$Rb=(L/W) \times Rsh/N=(0.48\ \mu m/0.08\ \mu m) \times 16.88\ \Omega/20=5.06\ \Omega.$$

Accordingly, the ballasting resistance for the given ESD protection device is 5.06 Ω per finger. If the ballasting resistance does not meet the requirement of a certain IC, the length and other variables can then be adjusted.

The physical dimensions in the embodiment of FIGS. 4–6 are only exemplary and not intended to limit the scope of the invention. The total device width depends on the required ESD strength. The number of contacts in each row over each source and drain region depends on the size of the active area. The number of fingers of the MOS ESD devices also depends on the size of the bonding pads of each MOS ESD device.

Based on the above discussion, there are many possible embodiments for designing the layout of resistive elements with a serpentine shape. The serpentine shape includes any meandering shape that can extend the resistance path from the drain to the contacts. Please note that the present invention is discussed in terms of. NMOS ESD devices. However, the present invention is also applicable to PMOS ESD devices in a similar manner. Various modifications are known to those skilled in the art without extensive discussions.

The above illustration, provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. An electrostatic discharge (ESD) protection device having a resistive element, comprising:
   a set of multi-finger transistors with gate, source, and drain terminals formed on a semiconductor substrate;
   at least one first region forming the source terminal of the set of multi-finger transistors;
   at least one second region forming the drain terminal of the set of multi-finger transistors; and
   at least one third region forming the resistive element, wherein the resistive element surrounds a contact in a spiral shape with one end coupled to the drain terminal and the other end coupled to a bonding pad through the contact for increasing a trigger voltage of the multi-finger transistors.

2. The ESD protection device of claim 1, wherein the bonding pad is a high positive voltage power supply (Vdd) pad or a complementary low voltage power supply (Vss) pad.

3. The ESD protection device of claim 2, wherein the source of the multi-finger transistor is coupled to either the Vdd pad or the Vss pad.

4. The ESD protection device of claim 1, wherein the resistive element is constructed by one or more active regions.

5. The ESD protection device of claim 4, wherein the active regions comprise silicided material.

6. The ESD protection device of claim 1, wherein the resistive element is formed by polysilicon material.

7. The ESD protection device of claim 1, wherein the resistive element is formed by metallization material.

8. The ESD protection device of claim 1, wherein a width of the resistive element follows approximately a predetermined minimum design rule.

9. The ESD protection device of claim 1, wherein the serpentine shape is either a clockwise spiral or a counter-clockwise spiral.

10. The ESD protection device of claim 1, wherein the drain terminal of the multi- finger transistor is coupled to the bonding pad via the resistive element.

11. An electrostatic discharge (ESD) protection device having a resistive element, comprising:
    a set of multi-finger NMOS transistors with gate, source, and drain terminals formed on an active area of a semiconductor substrate;
    at least one first region forming the source terminal of the set of multi-finger transistors;
    at least one second region forming the drain terminal of the set of multi-finger transistors; and
    at least one third region forming the resistive element, wherein the resistive element surrounds a contact in a spiral shape with one end coupled to the drain terminal and the other end coupled to a bonding pad through the contact for increasing a trigger voltage of the multi-finger transistors.

12. The ESD protection device of claim 11, wherein the bonding pad is a high positive voltage power supply (Vdd) pad or a complementary low voltage power supply (Vss) pad.

13. The ESD protection device of claim 12, wherein the source of the multi-finger transistor is coupled to either the Vdd pad or the Vss pad.

14. The ESD protection device of claim 11, wherein the resistive element is constructed by one or more active regions.

15. The ESD protection device of claim 14, wherein the active regions comprise silicided material.

16. The ESD protection device of claim 11, wherein the resistive element is formed by polysilicon material.

17. The ESD protection device of claim 11, wherein the resistive element is formed by metallization material.

18. The ESD protection device of claim 11, wherein a width of the resistive element follows approximately a predetermined minimum design rule.

19. The ESD protection device of claim 11, wherein the serpentine shape is either a clockwise spiral or a counter-clockwise spiral.

20. The ESD protection device of claim 11, wherein the drain terminal of the multi- finger transistor is coupled to the bonding pad via the resistive element.

* * * * *